United States Patent [19]

Hoeft

[11] Patent Number: 4,608,555

[45] Date of Patent: Aug. 26, 1986

[54] ANALOG TO DIGITAL FLASH CONVERTER

[76] Inventor: Werner H. Hoeft, 12746 Plymouth Dr., Saratoga, Calif. 95070

[21] Appl. No.: 450,929

[22] Filed: Dec. 20, 1982

[51] Int. Cl.$^4$ .............................................. H03M 1/36
[52] U.S. Cl. ......................... 340/347 AD; 340/347 M
[58] Field of Search ................................. 340/347 AD

[56] References Cited

U.S. PATENT DOCUMENTS

| | | | |
|---|---|---|---|
| 3,100,298 | 8/1963 | Fluhr | 340/347 AD |
| 3,968,486 | 7/1976 | Gerdes | 340/347 AD |
| 4,375,059 | 2/1983 | Schlig | 340/347 AD |
| 4,489,309 | 12/1984 | Schlig | 340/347 AD |

OTHER PUBLICATIONS

Jacob Millman, "Microelectronics" Copyright 1979, pp. 537–539 and 197.

Primary Examiner—Felix D. Gruber
Attorney, Agent, or Firm—Willis E. Higgins

[57] ABSTRACT

An analog to digital flash converter provides a multiple bit, parallel output arranged in more significant to less significant bits. The converter includes a voltage to current converter for providing an analog signal as an input current to a plurality of parallel converter stages. A reference signal input is independent of the analog signal input. Each of the converter stages receives the analog input current. Each stage has a comparator for comparing the analog input current with a dependent signal derived from the reference signal. The comparators are connected so that the dependent signal for each comparator is derived from the reference signal on the basis of outputs from each comparator of more significant bit stages. The dependent signal for each stage is derived by means of a switch in each stage connected to receive the output of the comparator in the next adjacent more significant bit converter stage, to control operation of the switch. The switch of each more significant stage is connected to supply the dependent signal of any next adjacent stage to the comparator of its stage and each less significant bit stage. The converter stages convert the analog input signal to digital output bits corresponding to the number of the stages from the converter simultaneously.

18 Claims, 6 Drawing Figures

| INPUT | LSB 1 | 2 | 3 | MSB 4 |
|---|---|---|---|---|
| 1.875 V | 1 | 1 | 1 | 1 |
| 1.750 V | 0 | 1 | 1 | 1 |
| 1.625 V | 1 | 0 | 1 | 1 |
| 1.500 V | 0 | 0 | 1 | 1 |
| 1.375 V | 1 | 1 | 0 | 1 |
| 1.250 V | 0 | 1 | 0 | 1 |
| 1.125 V | 1 | 0 | 0 | 1 |
| 1.000 V | 0 | 0 | 0 | 1 |
| 0.875 V | 1 | 1 | 1 | 0 |
| 0.750 V | 0 | 1 | 1 | 0 |
| 0.625 V | 1 | 0 | 1 | 0 |
| 0.500 V | 0 | 0 | 1 | 0 |
| 0.375 V | 1 | 1 | 0 | 0 |
| 0.250 V | 1 | 0 | 0 | 0 |
| 0.125 V | 0 | 1 | 0 | 0 |
| 0.000 V | 0 | 0 | 0 | 0 |

FULL SCALE = 2V − 1 LSB

FIG. 6

ANALOG TO DIGITAL FLASH CONVERTER

BACKGROUND OF THE INVENTION

1. Field of the Invention

This invention relates to an improved analog to digital (A/D) conversion circuit. More particularly, it relates to such an A/D conversion circuit which operates in a parallel mode, commonly known as a flash converter. Most especially, the invention relates to such an A/D converter in which the number of bits of resolution achievable by the A/D converter when implemented in integrated circuit form is not limited by the complexity limit of the circuit which can be fabricated in integrated circuit form.

2. Description of the Prior Art

High speed integrated circuit A/D converters have been provided in the prior art for the purpose of rapid conversion of analog signals to digital form for digital processing. The state of the art in such flash A/D converters is summarized by Beresford, R., Ed., "High Speed Data Conversion", Electronics, May 4, 1982, p 134–142. The state of the art in such flash A/D converters is further indicated in the following papers from the Proceedings, 1982 Wescon; Kauffman, S., "Multistage Error Correcting A/D Converters", Paper Number 30/1; Olsen, R., "Architecture and Applications of A/D Converters", Paper Number 30/2; and Wilson, G., "The Promise of Bipolar VLSI for High Speed A to D Converters", Paper Number 30/4.

As set forth in this prior art, conventional A/D converters with n-bit resolution require $(2^n - 1)$ comparators, or 255 comparators for an 8 bit resolution flash converter, and 1,023 comparators in the case of a 10 bit resolution flash converter. The necessity to provide such large numbers of comparators in these prior art flash converters means that 8 bit resolution is the limit in currently available integrated circuit flash A/D converters, with 10 bit resolution converters being considered for future products with further improvements in integrated circuit fabrication technology. Further improvements in flash A/D converter design are necessary in order to remove integrated circuit fabrication technology as a limiting factor in the resolution of integrated circuit flash A/D converters.

SUMMARY OF THE INVENTION

Accordingly, it is an object of this invention to provide an improved flash A/D converter circuit design in which integrated circuit fabrication technology is removed as a limiting factor in the resolution of the converter.

It is another object of the invention to provide a flash A/D converter in which the number of comparators in the converter does not increase exponentially with an increasing bit resolution of the converter.

The attainment of the foregoing and related objects may be achieved through use of the novel flash A/D converter herein disclosed. In accordance with this invention, an A/D converter provides a multiple bit, parallel output arranged in more significant to less significant bits. There is an input for a signal to be converted, and an input for a reference signal. The A/D converter has a plurality of converter stages. Each stage has a comparator for comparing the input signal with a variable signal derived from the reference signal. The comparators are connected so that the variable signal for each comparator is derived from the reference signal on the basis of outputs from each of the comparators of more significant bit converter stages.

In a preferred form of the invention, the converter includes means for providing an analog signal as an input to a plurality of parallel converter stages. Each of the stages converts the input to a bit of the output from the converter. Each of the converter stages includes a comparator connected to receive the input from the analog signal providing means. Each of these stages has a means for providing a variable reference to the comparator of the stage. Each variable reference providing means has a divider connected to provide a divided portion of the reference to the comparator of its converter stage. The reference is also provided to a switch in each stage. The switch of each converter stage is connected for selectively supplying the reference to the comparator of its converter stage and to the comparators of less significant bit converter stages to the stage containing the switch. The divider further provides the divided portion of the reference as an input to the variable reference supplying means of a next adjacent less significant bit converter stage. The comparator of each of the converter stages is connected to provide one output bit for the converter and to control the switch of the next adjacent less significant bit converter stage, so that the outputs of the switches depend on the output of their next adjacent more significant bit converter stage.

Utilizing dividers and switches to provide the reference currents for the comparators of each stage of the flash A/D converter in this manner means that only one comparator need be provided for each stage of the converter. As a result, adding additional converter stages to the flash A/D converter of this invention increases circuit complexity only linearly, rather than exponentially, as in the case of prior art flash A/D converters.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
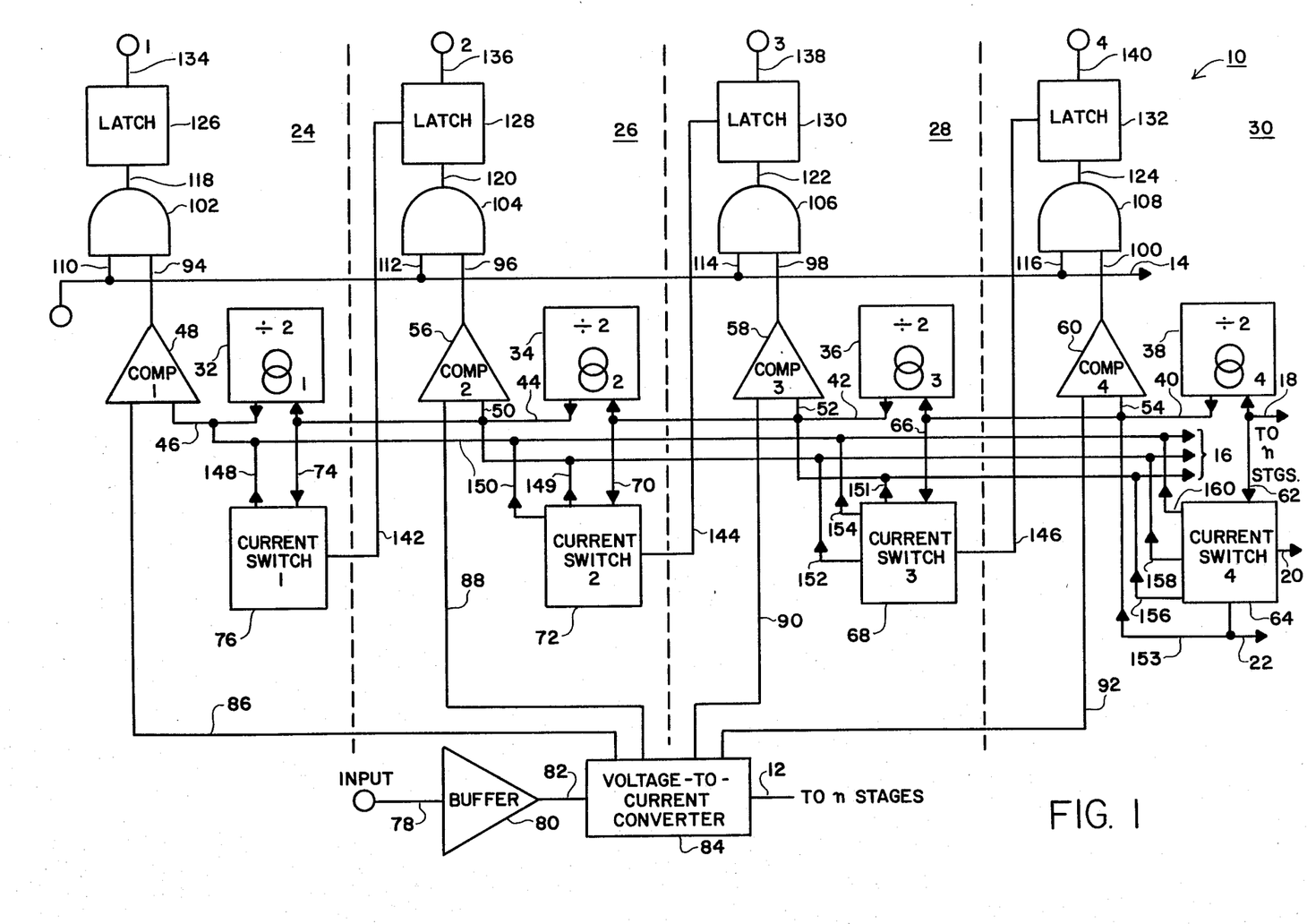
FIG. 1 is a block diagram of a current mode flash A/D converter in accordance with the invention.

Turning now to the drawings, more particularly to FIG. 1, there is shown a 4 bit flash A/D converter 10, with interconnection lines 12, 14, 16, 18, 20, and 22 for expansion of the converter 10 to n bits. The converter 10 includes four stages 24, 26, 28, and 30. Each of the stages 24–30 has a divide-by-2 current source 32, 34, 36, and 38, respectively. An output from the divide-by-2 current source 38 is provided on line 40 as an input to divide-by-2 current source 36. An output from the divide-by-2 current source 36 is supplied on line 42 as an input to divide-by-2 current source 34. An output from divide-by-2 current source 34 is supplied on line 44 as an input to divide-by-2 current source 32. Because divide-by-2 current source 32 is part of the least significant bit 24, its output is only supplied on line 46 to comparator 48 in stage 24. The outputs from divide-by-2 current sources 34, 36, and 38 are also respectively supplied on lines 50, 52, and 54 as inputs to comparators 56, 58, and 60 of the stages 26, 28, and 30. The input to divide-by-2 current source 38 is supplied on line 18 by another divide-by-2 current source (not shown) of a next adjacent more significant bit stage of the converter 10 to the stage 30. The most significant bit (not shown) of the comparator 10 receives an input to its divide-by-2 current source from a current source (also not shown).

The input to divide-by-2 current source 38 is also supplied on line 62 as an input to current switch 64. Similarly, the input to divide-by-2 current source 36 on line 40 is also supplied on line 66 as an input to current switch 68. The input to divide-by-2 current source 34 on line 42 is also supplied on line 70 as an input to current switch 72. The input to divide-by-2 current source 32 on line 44 is also supplied on line 74 as an input to current switch 76.

An analog signal to be converted to digital form in the converter 10 is supplied on line 78 as an input to buffer amplifier 80. The output of buffer amplifier 80 is supplied on line 82 as an input to voltage-to-current converter 84. The voltage-to-current converter 84 supplies equal currents on lines 86, 88, 90, and 92, respectively, as inputs to the comparators 48, 56, 58, and 60. Outputs from the comparators 48, 56, 58, and 60 are respectively supplied on lines 94, 96, 98, and 100 to AND gates 102, 104, 106, and 108. The other input to AND gates 102, 104, 106, and 108 is supplied from gate control line 14, respectively, on lines 110, 112, 114, and 116. The outputs from AND gates 102, 104, 106, and 108 are respectively supplied on lines 118, 120, 122, and 124 as inputs to latches 126, 128, 130, and 132. The outputs from stages 24, 26, 28, and 30 of the converter 10 are respectively supplied on lines 134, 136, 138, and 140.

Latch 128 is connected by line 142 to control operation of current switch 76. Latch 130 is connected by line 144 to control operation of current switch 72. Latch 132 is connected by line 146 to control operation of current switch 68. A corresponding latch (not shown) in a next adjacent more significant bit stage (not shown) to the right of stage 30 is connected by line 20 to control operation of the current switch 64. Line 148 from current switch 76 connects an output from current switch 76 to comparator 48. Corresponding lines 149, 151, and 153 from current switches 72, 68, and 64, respectively, connect those current switches to comparators 56, 58, and 60. Line 150 connects current switch 72 to input line 46 for comparator 48. Line 152 connects current switch 68 to input line 50 for comparator 56. Line 154 connects current switch 68 to input line 46 for comparator 48. Line 156 connects current switch 64 to input line 52 for comparator 58. Line 158 connects current switch 64 to input line 50 for comparator 56. Line 160 connects current switch 64 to input line 46 for comparator 48.

In operation of the flash A/D converter 10, the current switches 76, 72, 68, and 64 are activated by their associated latches 128, 130, 132, and the latch in the next adjacent stage to the right of stage 30 so that output currents from the current switches 76, 72, 68, and 64 are added to the reference currents for comparators 48, 56, 58, and 60, supplied by the divide-by-2 current sources 32, 34, 36, and 38. Thus, in the case of comparator 48, the reference current supplied by the divide-by-2 current source 32 will be raised by the output of current switch 76, current switch 72, current switch 68 or current switch 64, or by the output of all of the current switches 76, 72, 68, and 64. In case of comparator 60, its reference current supplied by divide-by-2 current source 38 on line 40 is raised by the output of current switch 64 alone. Whenever the state of comparators 56, 58, or 60 changes, their associated latches 128, 130, and 132 are updated and held by the gate control on line 14. An update in latches 128, 130, or 132 will also result in a change in the appropriate control signal on lines 142, 144, or 146 to the current switches 76, 72, or 68.

Since each comparator 48, 56, 58, and 60 compares the same input current, a true parallel or flash conversion results. The maximum number of bits that can be converted in parallel is not limited by circuit complexity, but by the accuracy in manufacture of the current division and offset voltages.

Figure 2:
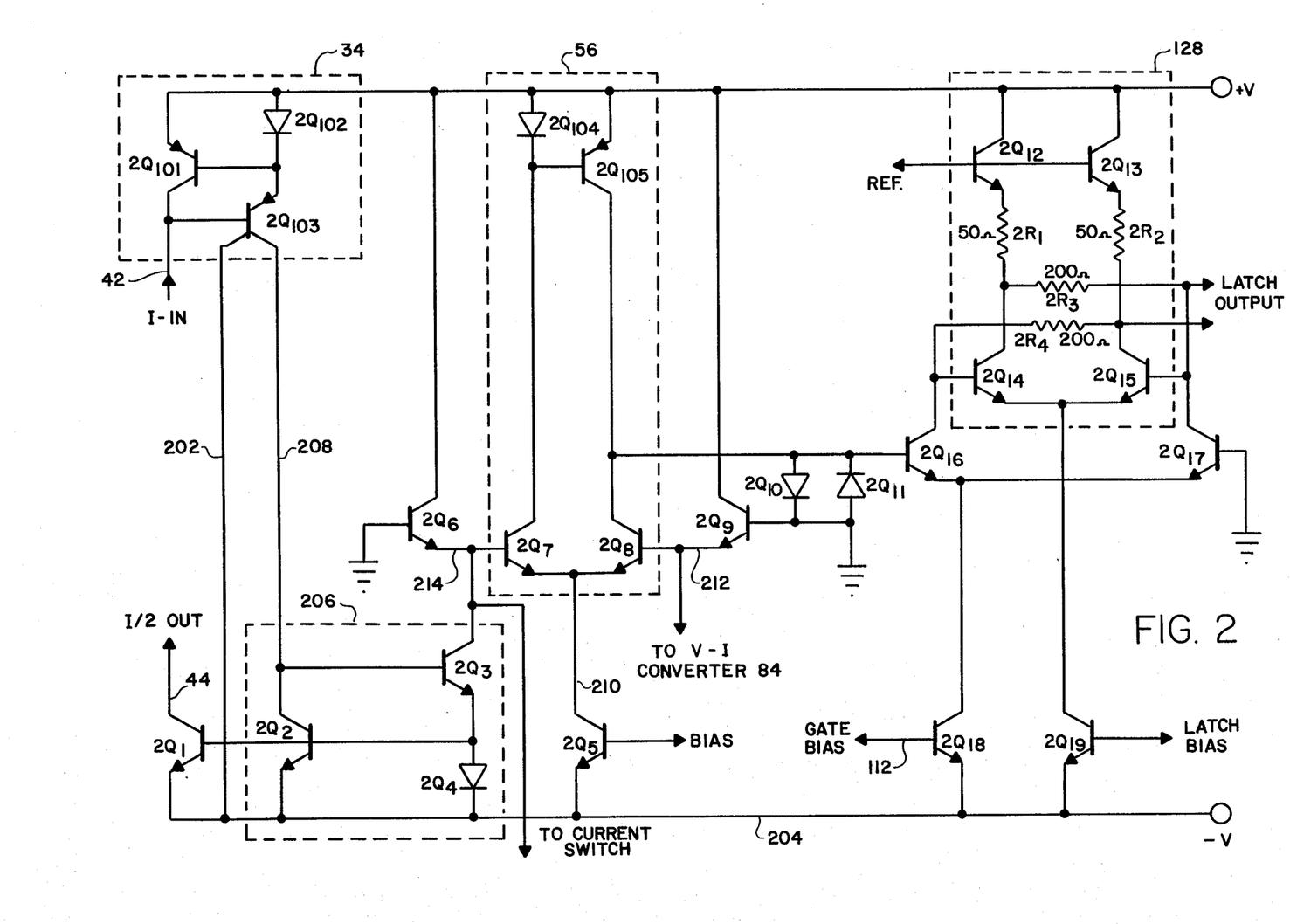
FIG. 2 is a circuit schematic diagram of a portion of the flash A/D converter shown in FIG. 1.

FIG. 2 shows a circuit implementation of the divide-by-2 current source 34, comparator 56, AND gate 104 and latch 128, shown in FIG. 1. The reference current on line 42 enters the divide-by-2 current source 34, which is configured as a Wilson current source, at the base of transistor 2Q103. Diode 2Q102 and feedback transistor 2Q101 comprise the remainder of the Wilson current source. Transistor 2Q103 has two equal collectors to provide the current division by 2. Lines 202 and 204 connect one of the collectors of transistor 2Q103 to a - V potential. The other collector of transistor 2Q103 feeds a second Wilson current source 206, comprising transistors 2Q2, 2Q3, and 2Q4, on line 208. The collector current of transistor 2Q3 sets the reference current for the comparator 56 via transistor 2Q6. Transistor 2Q1 provides the I/2 output current on line 44 for the following stage 24 (FIG. 1) of the converter. The comparator 56 comprises transistors 2Q7, 2Q8, and 2Q104, and 2Q105, biased via transistor 2Q5 on line 210. The comparator 56 receives the input signal from the voltage-to-current converter 84 via transistor 2Q9 on line 212. The input current on line 212 is compared to the reference current on line 214 from transistor 2Q6. Whenever the input current on line 212 exceeds the reference current on line 214, the collector of transistor 2Q105 goes high, turning on transistor 2Q16 and turning off transister 2Q17, which form a gated differential amplifier. The collectors of transistors 2Q16 and 2Q17 then force latch 128, formed from transistors 2Q14, 2Q15, and their associated loads 2R1, 2Q12, and 2R2, 2Q13 in the opposite position. The latch 28 will stay in that position as long as the input current on line 212 exceeds the reference current on line 214, or by turning off gate bias transistor 2Q18 via line 112, thus removing any change in status of the comparator 56 from latch 128.

Figure 3:
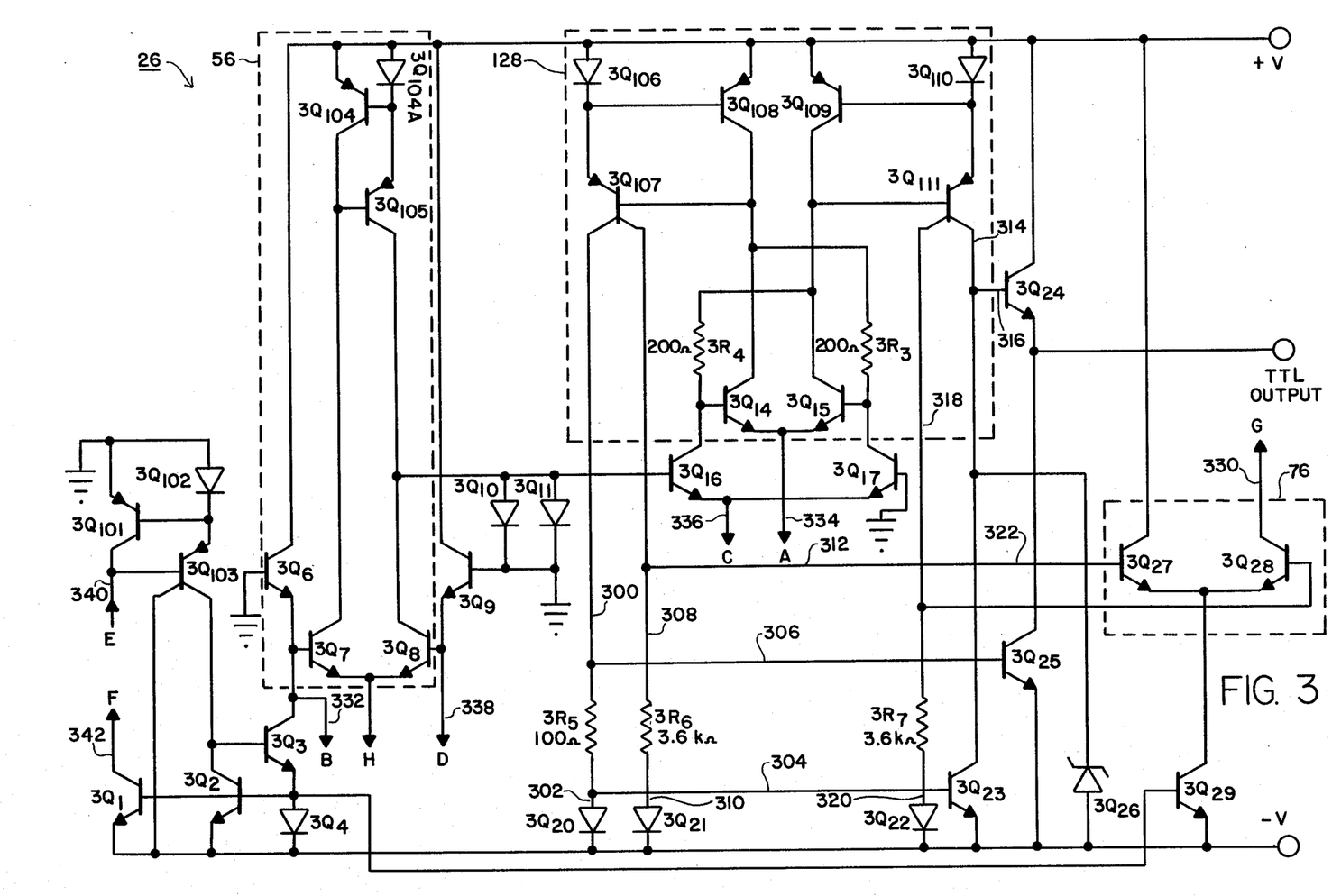
FIG. 3 is a circuit schematic diagram of another embodiment of a portion of the flash A/D converter shown in FIG. 1.

FIG. 3 shows the full implementation of stage 26 in the flash A/D converter 10 of FIG. 1. Corresponding circuit elements in FIG. 3 to those shown in FIG. 2 are preceded by the number 3, rather than the number 2, as used in FIG. 2. The output of comparator 26 in FIG. 3 utilizes a Wilson current mirror, consisting of transistors 3Q104, and 3Q105 and diode 3Q104A, for higher accuracy in the current comparison. The latch 128 has been expanded to provide a transistor—transistor logic (TTL) output and drive for the current switch 76 (FIG. 1). The gated latch drive consisting of transistors 3Q16 and 3Q17 is connected to transistors 3Q14 and 3Q15 of the latch 128 with the load of the latch 128 presented by the two junction voltages of transistor 3Q107 and diode 3Q106 and transistor 3Q111 and diode 3Q110. These loads are also hooked up as Wilson-type current mirrors, with the outputs at 3Q107 and 3Q111 having split collectors. The output current is steered by the latch 128 into either transistor 3Q107 or 3Q111. One of the collectors of transistor 3Q107 is connected to resistor 3R5 and diode 3Q20 by lines 300 and 302. This collector of transistor 3Q107 also supplies the drive for transistors 3Q23 and 3Q25 on lines 304 and 306, respectively, to provide the TTL output. The other collector of transistor 3Q107 is connected to resistor 3R6 and transistor 3Q21 by lines 308 and 310. This collector of transistor 3Q107 provides the drive for transistor 3Q27 of current switch 76 on line 312. Transistor 3Q1111 supplies the opposite phase current to transistor 3Q24 of the TTL output on lines 314 and 316. The opposite phase current is also supplied via line 318, resistor 3R7, line 320, diode 3Q22 and line 322 to transistor 3Q28. When the TTL signal goes high, the reference current from transistors 3Q2, 3Q3, and 3Q4 move via transistors 3Q29 and 3Q28 to line 330, which is connected to a line in the previous stage 28 corresponding to line 332. The reference current is then raised by the value at line 330. Line 334 is connected to the reference bias in the power supply current source 34. Line 332 is connected to current switch 68 in the previous stage 28 of the converter 10. Line 336 is connected to the reference bias in the power supply. Line 338 connects to the voltage-to-current converter 84. Line 340 connects, via line 42, to the output of the previous stage reference divide-by-2 current source 36. Line 342 connects, via line 44, to a line in reference divide-by-2 current source 32 of stage 24 corresponding to line 340 in FIG. 3.

As can be seen in FIG. 1, an additional current switch is added to each stage 26, 28, and 30 of the converter 10, moving from left to right toward the most significant bit. Thus, for an 8-bit system, the last or most significant bit stage would have 7 current switches.

Figure 4:
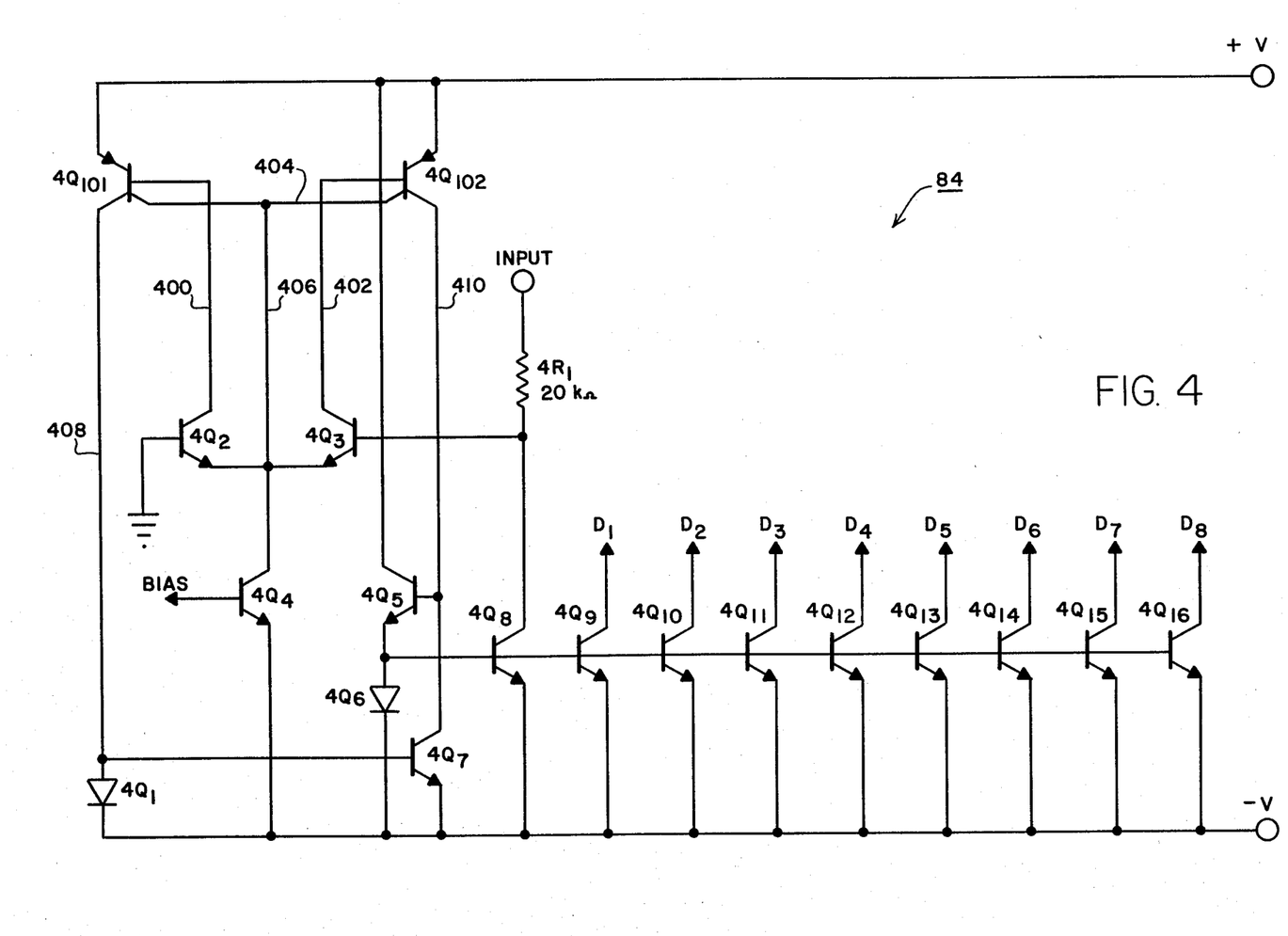
FIG. 4 is a circuit schematic diagram of another portion of the flash A/D converter shown in FIG. 1.

FIG. 4 is a circuit diagram of the voltage to current converter 84 as shown in FIG. 1. The converter 84 consists of a differential amplifier formed by transistors 4Q2 and 4Q3, with the collectors of these transistors connected by lines 400 and 402 to drive the bases of two current mirror transistors 4Q101 and 4Q102, each of which have split collectors. Lines 404 and 406 connect one split collector of each transistor 4Q101 and 4Q102 to the emitters of transistors 4Q2 and 4Q3, thus lowering the base current of transistors 4Q2 and 4Q3 by the current gain of the PNP transistors 4Q101 and 4Q102. The other collector of transistor 4Q101 is connected by line 408 to diode 4Q1 and is mirrored up via transistor 4Q7 to the other collector of transistor 4Q102 on line 410. Under balanced condition, the current through transistor 4Q5 will be that of transistor 4Q1. Under dynamic condition, the current through transistor 4Q5 will be that of transistor 4Q4 times the current gain of transistor 4Q5. With the feedback arrangement through transistor 4Q8, the current in transistors 4Q8 through 4Q16 will equal that through resistor 4R1, minus the base current of transistor 4Q5. All reference current outputs from the converter 84 will therefore produce equal currents to all of the comparators 48, 56, 58, and 60, as well as additional comparators for stages not shown in the flash A/D converter 10 of FIG. 1.

Figure 5:
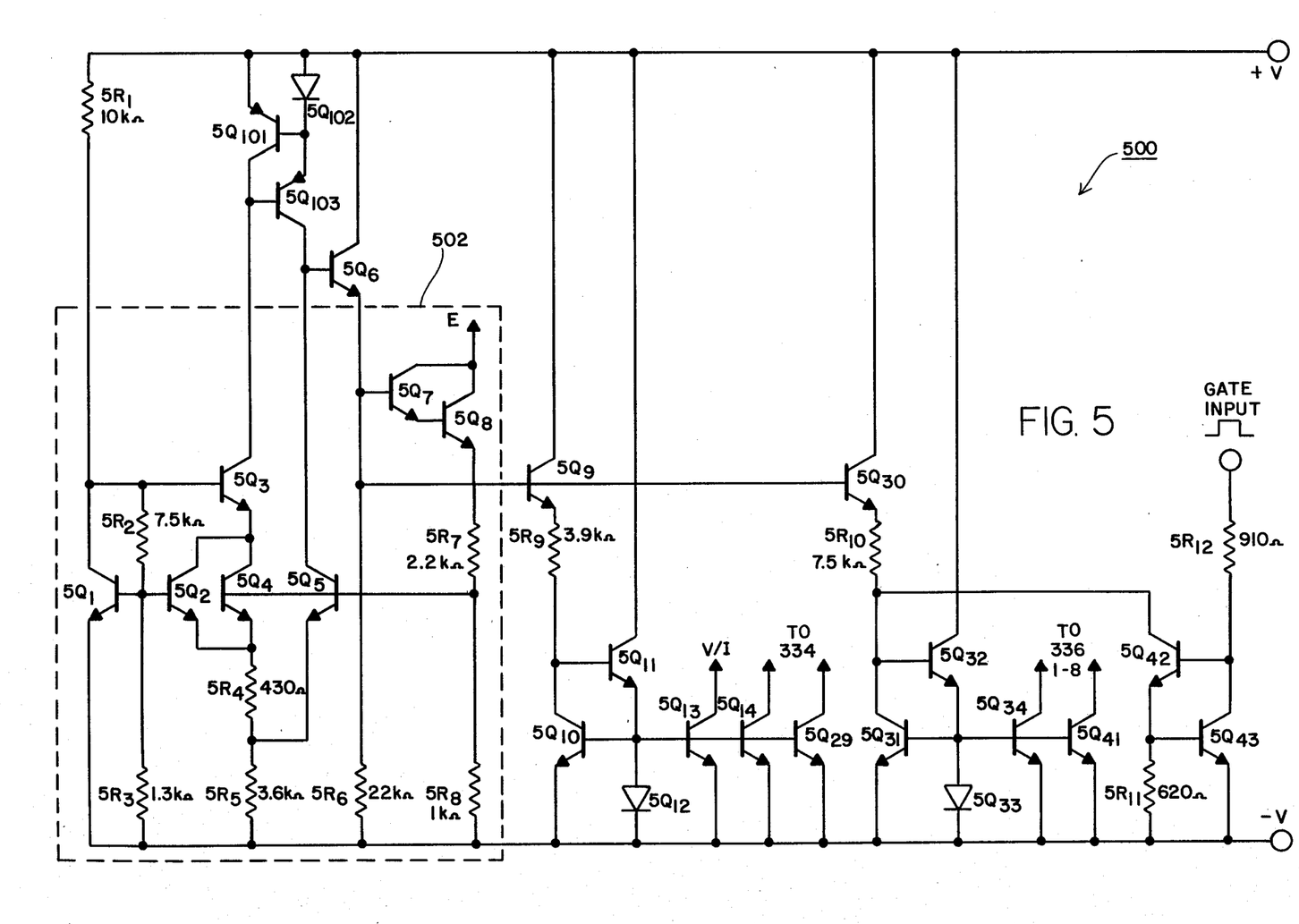
FIG. 5 is a circuit schematic diagram of another portion of the flash A/D converter shown in FIG. 1.

FIG. 5 is a current supply 500 for the reference current. The current supply circuit 500 is a standard band gap reference voltage source 502 consisting of transistors 5Q1 through 5Q8. The bias voltages for buffer amplifier 80, comparators 48, 56, 58, and 60, latch driver and latches 126, 128, 130, and 132 are generated via the emitter-follower transistors 5Q9 and 5Q30, which develop the desired currents via resistors 5R9 and 5R10. The gating input is supplied through transistors 5Q42 and 5Q43, which turn the current to the latch driver on and off. The collectors of transistors 5Q7 and 5Q8 set the initial reference current for the current dividers 32, 34, 36, 38, and the corresponding reference current divide-by-2 circuits in additional stages of the flash A/D converter 10 of FIG. 1.

Figure 6:
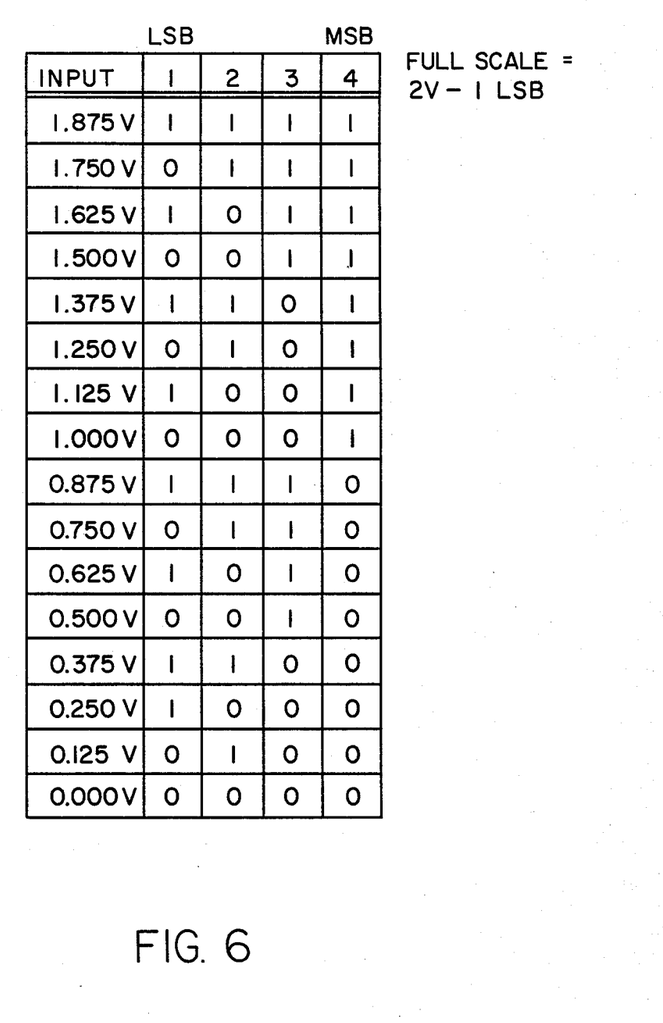
FIG. 6 is a truth table useful for understanding operation of the flash A/D converter shown in FIGS. 1–5.

FIG. 6 is a truth table for the 4 bit flash A/D converter shown in FIG. 1. The table shows the output state for each bit at the different input voltages shown in the first column. Full scale input is 2 volts—1 least significant bit or 1.875 volts. Greater resolution is, of course, available with a greater number of bits, or stages 24–30, in the converter 10.

It should now be readily apparent to those skilled in the art that a flash A/D converter capable of achieving the stated objects of the invention have been provided. Because only one comparator need be provided for each bit of resolution in the flash A/D converter of this invention, the number of circuit elements required in the converter does not increase exponentially with each additional bit of resolution added to the converter. As a result, fabrication technology for an integrated circuit incorporating the flash A/D converter of this invention is not a limiting factor in the resolution of the converter.

It should further be apparent to those skilled in the art that various changes in form and details of the invention as shown and described may be made. For example, the input and reference currents for each stage of the converter 10 may be converted to voltages for the comparison in comparators 48, 56, 58, and 60. This can be done by modifying the circuit in FIG. 2 to insert a resistor between ground and the base of transistor 2Q6 and a resistor between the ground and base of transistor 2Q9. The voltage-to-current converter 84 is then connected to the base of transistor 2Q9, and the collector of transistor 2Q3 is connected to the base of transistor 2Q6. Alternatively, the reference inputs can be supplied as voltages and the output of buffer amplifier 80 connected to the bases of transistors 2Q9 in each stage to eliminate the voltage-to-current converter 84. It is intended that such changes be included within the spirit and scope of the claims appended hereto.

What is claimed is:

1. An analog to digital converter providing a multiple bit, parallel output arranged in more significant to less significant bits, comprising means for providing an analog input signal as a parallel input to each of a plurality of parallel converter stages, each of said stages converting said input to a bit of the output from said analog to digital converter, each of said converter stages other than a most significant stage including a comparator connected to receive the input from said analog signal providing means in equivalent form, means for providing a reference which is dependent on a state of more significant bit stages to the comparators of each of said converter stages, each dependent reference providing means having a divider connected to provide a first signal derived from the dependent reference of any next adjacent more significant bit converter stage having such a dependent reference to the comparator of its converter stage, and a switch, said dependent reference providing means also providing a second signal comprising the dependent reference of any next adjacent more significant bit converter stage having such a dependent reference to the switch, the switch of each converter stage being connected for selectively supplying the second signal to the comparator of its converter stage and to the comparators of any less significant bit converter stages, the divider of each converter stage further providing the first signal as an input to the divider of said dependent reference providing means of any next adjacent less significant bit converter stage, the comparator of each of said converter stages being connected to provide one output bit for said analog to digital converter and to control the switch of any next adjacent less significant bit converter stage for selectively supplying the second signal in that next adjacent less significant bit converter stage, said plurality of converter stages further being configured to carry out conversion of the analog input signal to a like plurality of parallel digital output bits from said converter simultaneously.

2. The analog to digital converter of claim 1 in which each of said comparators is connected to supply its output to a latch in each stage, the latches of more significant bit stages being connected to control the switches of adjacent less significant bit stages.

3. The analog to digital converter of claim 2 in which the comparators are connected to the latches through AND gates.

4. The analog to digital converter of claim 1 in which the switches are current switches, the input and the dependent reference are supplied to the comparators as currents, and the divider is a current divider.

5. The analog to digital converter of claim 4 in which the latches of the more significant bit stages include a transistor - transistor logic output connected to the current switches of less significant bit stages.

6. The analog to digital converter of claim 4 in which the current divider includes a multiple collector transistor, with the divided current being provided in each of the multiple collectors.

7. The analog to digital converter of claim 6 in which the current divider is a divide-by-2 current divider.

8. The analog to digital converter of claim 1 in which each of the comparators comprises a differential amplifier.

9. The analog to digital converter of claim 8 in which each of the comparators includes an output utilizing a current mirror.

10. An analog to digital converter for providing a multiple bit, parallel output arranged in more significant to less significant bits comprising a plurality of parallel, equivalent inputs for a signal to be converted, an input for a reference signal independent of said plurality of parallel, equivalent inputs for the signal to be converted, a plurality of converter stages, each of said plurality of converter stages including one of said plurality of parallel equivalent inputs for the signal to be converted, each of said plurality of converter stages other than a most significant stage having a comparator for comparing the input signal to be converted with a signal dependent on a state of more significant bit stages and derived from the reference signal, the comparators being connected so that the dependent signal for each comparator is derived from the reference signal on the basis of outputs from each of the comparators of more significant bit converter stages, the dependent signal for each stage being derived by means of a switch in each stage connected to receive the output of the comparator in the next adjacent more significant bit converter stage, to control operation of the switch, the switch of each more significant stage other than a penultimate significant stage being connected to supply as a first signal the dependent signal of any next adjacent more significant stage to the comparator of its stage and each less significant bit stage, said plurality of converter stages further being configured to convert the analog input signal to a like plurality of parallel digital output bits from said converter simultaneously.

11. The analog to digital converter of claim 10 in which the switch of each stage is a current switch.

12. The analog to digital converter of claim 10 in which the output of the comparator is connected to the switch through a latch in each stage.

13. The analog to digital converter of claim 12 in which the output of the comparator is connected to the latch through an AND gate.

14. The analog to digital converter of claim 10 in which each less significant bit converter stage of said analog to digital converter includes a divider which receives an output from the divider of the adjacent more significant bit stage as its input, the divider of the most significant bit stage receiving the reference signal as its input, the divider of each stage providing its output as a second part of the dependent signal supplied to the comparator of each stage.

15. The analog to digital converter of claim 14 in which the the switch is a current switch and the divider is a current divider in each stage.

16. The analog to digital converter of claim 15 in which the input for the signal to be converted is connected to a voltage-to-current converter, said voltage-to-current converter supplying the converted input as a current to each of the comparators.

17. The analog to digital converter of claim 14 in which the output of the comparator is connected to the switch through a latch in each case.

18. The analog to digital converter of claim 17 in which the output of the comparator is connected to the latch through an AND gate.

* * * * *